United States Patent
Tomita et al.

(10) Patent No.: US 12,191,150 B2
(45) Date of Patent: Jan. 7, 2025

(54) SWITCHING DEVICE AND METHOD FOR MANUFACTURING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP); Kochi Prefectural Public University Corporation, Kochi (JP)

(72) Inventors: Hidemoto Tomita, Nisshin (JP); Takashi Okawa, Nisshin (JP); Toshiyuki Kawaharamura, Kami (JP); Li Liu, Kami (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); Kochi Prefectural Public University Corporation, Kochi (JP)

(*) Notice: Subject to any disclaimer, the term of this patent is extended or adjusted under 35 U.S.C. 154(b) by 377 days.

(21) Appl. No.: 17/590,988

(22) Filed: Feb. 2, 2022

(65) Prior Publication Data
US 2022/0270882 A1 Aug. 25, 2022

(30) Foreign Application Priority Data
Feb. 25, 2021 (JP) .................... 2021-029179

(51) Int. Cl.
*H01L 21/28* (2006.01)
*H01L 21/02* (2006.01)
(Continued)

(52) U.S. Cl.
CPC .. *H01L 21/28264* (2013.01); *H01L 21/02164* (2013.01); *H01L 21/0228* (2013.01); *H01L 29/51* (2013.01); *H01L 29/513* (2013.01); *H01L 21/02175* (2013.01); *H01L 21/02241* (2013.01); *H01L 29/2003* (2013.01)

(58) Field of Classification Search
CPC ......... H01L 21/28264; H01L 21/02164; H01L 21/0228; H01L 29/51; H01L 29/513;
(Continued)

(56) References Cited

U.S. PATENT DOCUMENTS

2016/0013282 A1 1/2016 Murakami et al.
2019/0019873 A1* 1/2019 Shiozaki ........... H01L 29/66522

FOREIGN PATENT DOCUMENTS

JP 2014154734 A 8/2014
JP 2017022294 A 1/2017
(Continued)

OTHER PUBLICATIONS

U.S. Appl. No. 17/591,012, filed Feb. 2, 2022, Okawa et al.
(Continued)

*Primary Examiner* — Patricia D Valenzuela
(74) *Attorney, Agent, or Firm* — Posz Law Group, PLC

(57) ABSTRACT

A switching includes a gallium nitride semiconductor and a gate insulation film. The gate insulation film is made of silicon oxide and disposed above the gallium nitride semiconductor layer. An interface between the gallium nitride insulation film and the gate insulation film is either free of a gallium oxide layer or provided with the gallium oxide layer with a thickness of 1 nanometer or smaller.

5 Claims, 12 Drawing Sheets

(51) Int. Cl.
 H01L 29/20 (2006.01)
 H01L 29/51 (2006.01)
(58) Field of Classification Search
 CPC .......... H01L 29/2003; H01L 21/02271; H01L 21/02282; H01L 21/02288; H01L 29/66522; H01L 29/66712; H01L 29/7786; H01L 29/7802; H01L 21/02241; H01L 21/02175
 See application file for complete search history.

(56) References Cited

FOREIGN PATENT DOCUMENTS

| JP | 2019012826 A | 1/2019 |
|----|--------------|--------|
| JP | 2020-035928 A | 3/2020 |

OTHER PUBLICATIONS

"Vertical GaN-based trench metal oxide semiconductor field-effect transistors on a freestanding GaN substrate with blocking voltage of 1.6 kV", Appl. Phys. Express 7, 021002(2014).

"GaN MOSFET characteristics of the controlled interface", The 65th JSAP Spring Meeting 2018, 19p-C302-1 (2018).

"X-ray photoelectron spectroscopy insights on interfaces between SiO2 films and GaN substrates: differences due to depositional technique", Jpn. J. Appl. Phys. 59 090902 (2020).

"Physics on development of open-air atmospheric pressure thin film fabrication technique using mist droplets: Control of precursor flow", Jpn. J. Appl. Phys. 53, 05FF08 (2014).

"Fabrication of Silicon Oxide Thin Films by Mist Chemical Vapor Deposition Method from Polysilazane and Ozone as Sources", Jpn. J. Appl. Phys. 54, 090201 (2012).

* cited by examiner

SWITCHING DEVICE AND METHOD FOR MANUFACTURING THE SAME

CROSS REFERENCE TO RELATED APPLICATION

This application is based on Japanese Patent Application No. 2021-029179 filed on Feb. 25, 2021, the disclosure of which is incorporated herein by reference.

TECHNICAL FIELD

The present disclosure relates to a switching device and a method for manufacturing the switching device.

BACKGROUND

A method for manufacturing a switching device may include formation of a first gate insulation film and formation of a second gate insulation film.

SUMMARY

The present disclosure describes a switching device having a gallium nitride semiconductor layer and a gate insulation film, and further describes a method for manufacturing the switching device including formation of the gate insulation film.

BRIEF DESCRIPTION OF THE DRAWINGS

The objects, features and advantages of the present disclosure will become more apparent from the following detailed description made with reference to the accompanying drawings. In the drawings.

DETAILED DESCRIPTION

Figure 1:
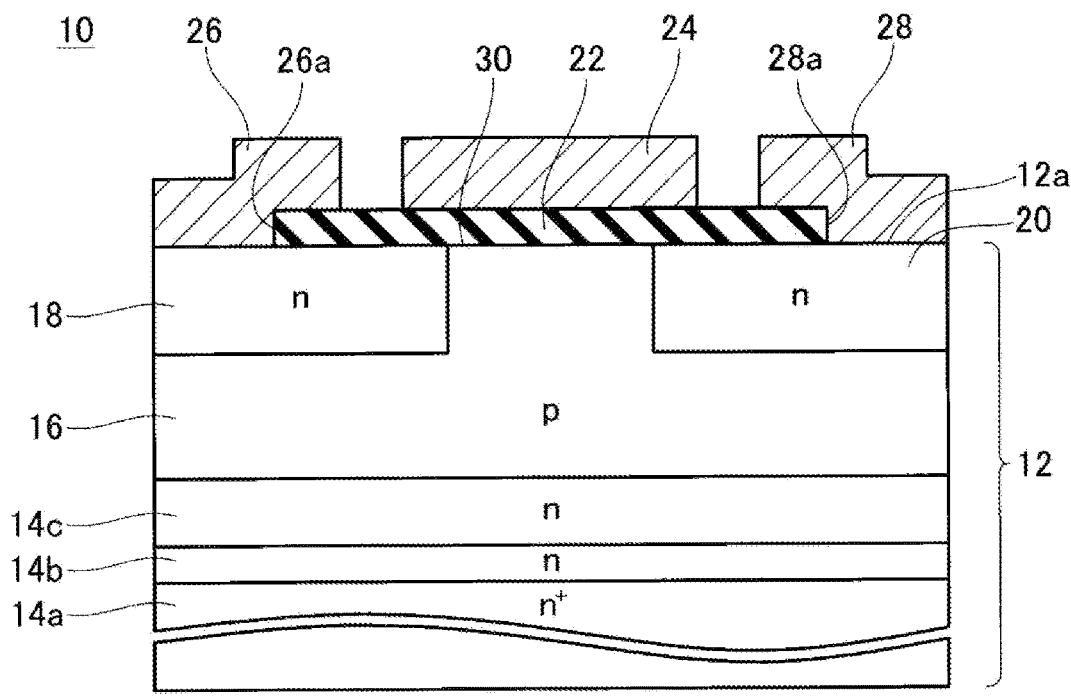
FIG. 1 is a cross-sectional view of a switching device according to first to fifth embodiments.

A method for manufacturing a switching device may include formation of a first gate insulation film and a second gate insulation film. In the formation of the first gate insulating film, the first gate insulating film is formed above a gallium nitride semiconductor layer by an atomic layer deposition (ALD) method using ozone as an oxidation agent. In the formation of the second gate insulating film, the second gate insulating film is formed above the first gate insulating film by the ALD method using an oxygen plasma as an oxidation agent. A gate electrode is formed above the second gate insulating film.

In the method described above, the first gate insulation film is exposed to the oxygen plasma, in other words, oxygen gas in a plasma state in the formation of the second gate insulation film. Since the oxygen plasma has a high oxidation level, in the formation of the second gate insulation film, the gallium nitride semiconductor at the bottom part of the first gate insulation film is oxidized. Therefore, a gallium oxide layer is formed at an interface between the first gate insulation film and the gallium nitride semiconductor layer. As a result, interface states are generated at this interface with high density, and the performance of the switching device may deteriorate.

According to a first aspect of the present disclosure, a switching device includes a gallium nitride semiconductor and a gate insulation film. The gate insulation film is made of silicon oxide and disposed above the gallium nitride semiconductor layer. An interface between the gallium nitride insulation film and the gate insulation film is either free of a gallium oxide layer or provided with the gallium oxide layer with a thickness of 1 nanometer or smaller.

The switching device may be any of switching devices as long as the device has a gate insulation film. For example, the switching device may be an electrical field effect transistor (FET) or a high electron mobility transistor (HEMT).

The gallium nitride semiconductor layer is a semiconductor layer having gallium nitride as a main component. For example, the gallium nitride semiconductor layer may be made of gallium nitride (GaN), or may be made of indium gallium nitride (InGaN), or may be made of aluminum gallium nitride (AlGaN), or may be made of indium aluminum gallium nitride (InAlGaN).

Silicon oxide is a compound containing a bond between silicon (Si) and oxygen (O). For example, the silicon oxide may be $SiO_2$ or SiON.

In this switching device, a gallium oxide layer does not exist at the interface between the gallium nitride semiconductor layer and the gate insulation film, or the thickness of the gallium oxide layer existing at the interface between the gallium nitride semiconductor layer and the gate insulation film is 1 nanometer (nm) or less. Therefore, there are few interface states existing at the interface between the gallium nitride semiconductor and the gate insulation film. Thus, the switching device has a higher capability.

According to a second aspect of the present disclosure, a method for manufacturing a switching device includes formation of a gate insulation film made of silicon oxide above a gallium nitride semiconductor layer by supply of a film-forming source material having silicon and an oxidizing gas in a non-plasma state to a surface of the gallium nitride semiconductor layer. The method is free of an exposure of the gate insulation film to an oxidizing gas in a plasma state.

The oxidizing gas refers to a gas capable of oxidizing silicon. For example, the oxidizing gas may be, for example, oxygen gas, water vapor, or ozone.

In the manufacturing method, since the oxidizing gas in a non-plasma state is used in the formation of the gate insulation film, it is possible to suppress the oxidation of the gallium nitride semiconductor layer at the interface between the gate insulation film and the gallium nitride semiconductor layer. Since the manufacturing method is without the exposure of the gate insulation film to the oxidizing gas in the plasma state, it is possible to suppress the oxidation of the nitride gallium semiconductor layer at the interface between the gate insulation film and the nitride gallium semiconductor layer after the formation of the gate insulation film. According to the manufacturing method, it is possible to suppress the formation of the gallium oxide layer at the interface between the gate insulation film and the gallium nitride semiconductor layer. Therefore, it is possible to manufacture the switching device having higher capability according to the manufacturing method.

The present disclosure describes an example of manufacturing a switching device. In this example, source material for film formation may be dissolved and a solution is provided to the surface of a gallium nitride semiconductor layer in the formation of a gate insulation film. The solution in which the source material for film formation is dissolved contains a solvent. Mist may be generated from the solution and the mist may be provided to the surface of the gallium nitride semiconductor layer. An oxidizing gas may be supplied to the surface of the gallium nitride semiconductor layer while the solution is spray-coated on the surface of the gallium nitride semiconductor layer. An oxidizing gas may be provided to the surface of the gallium nitride semiconductor layer while the solution is coated on the surface of the gallium nitride semiconductor layer through an inkjet method. Droplets of the solution may be generated by generating bubbles in the solution, and the droplets and the oxidizing gas may be supplied to the surface of the gallium nitride semiconductor layer.

Therefore, it is possible to form a suitable gallium nitride semiconductor layer above the gallium nitride semiconductor layer.

The present disclosure describes another example of manufacturing the switching device. In this example, the supply of a source gas having source material for film formation to the surface of the gallium nitride semiconductor layer and the supply of the oxidizing gas to the surface of the gallium nitride semiconductor layer may be repeated multiple times.

Therefore, it is possible to form a suitable gallium nitride semiconductor layer above the gallium nitride semiconductor layer.

In any one of the manufacturing methods described in the present disclosure, the oxidizing gas may be ozone.

A switching device 10 described in one of embodiments illustrated in FIG. 1 is a Metal-Oxide-Semiconductor Field-Effect Transistor (MOSFET). The switching device 10 includes a gallium nitride semiconductor substrate 12. The gallium nitride semiconductor substrate 12 has a high-concentration n-type layer 14a, a buffer layer 14b, a drift layer 14c, a body layer 16, a source layer 18, and a drain layer 20. The high-concentration n-type layer 14a may also be referred to as an $n^+$ type layer 14a in the present disclosure. The $n^+$ type layer 14a is provided in a region including the lower surface of the gallium nitride semiconductor substrate 12. The buffer layer 14b is an n-type layer having a lower concentration of n-type impurities than the $n^+$ type layer 14a, and is provided above the $n^+$ type layer 14a. The drift layer 14c is an n-type layer having an n-type impurity concentration equivalent to that of the buffer layer 14b, and is provided above the buffer layer 14b. The body layer 16 is a p-type layer, and is provided above the drift layer 14c. The source layer 18 and the drain layer 20 are n-type layers, and are provided above the body layer 16. The source layer 18 and the drain layer 20 are provided in a region partially including a top surface 12a of the gallium nitride semiconductor substrate 12. The source layer 18 and the drain layer 20 are separated from each other. The body layer 16 is provided between the source layer 18 and the drain layer 20, and the source layer 18 is separated from the drain layer 20 by the body layer 16.

A gate insulation film 22, a gate electrode 24, a source electrode 26 and a drain electrode 28 are arranged above the gallium nitride semiconductor substrate 12.

The gate insulation film 22 is made of silicon oxide such as $SiO_2$ or SiON. The gate insulation film 22 is arranged above the gallium nitride semiconductor substrate 12. The gate insulation film 22 extends from the surface of the source layer 18 as a part of the top surface 12a of the gallium nitride semiconductor substrate 12 to the surface of the drain layer 20 as a part of the top surface 12a of the gallium nitride semiconductor substrate 12. The gate insulation film 22 is in contact with the source layer 18, the body layer 16 and the drain layer 20 in the top surface 12a of the gallium nitride semiconductor substrate 12.

The gate electrode 24 is made of a conductor such as metal or polysilicon. The gate electrode 24 is arranged above the gate insulation film 22. The gate electrode 24 extends from the top portion of the source layer 18 to the top portion of the drain layer 20. The gate electrode 24 faces the source layer 18, the body layer 16 and the drain layer 20 via the gate insulation film 22.

The source electrode 26 is made of a conductor. The source electrode 26 is arranged above the source layer 18. The source electrode 26 is in ohmic contact with the source layer 18.

The drain electrode 28 is made of a conductor. The drain electrode 28 is arranged above the drain layer 20. The drain electrode 28 is in ohmic contact with the drain layer 20.

When a potential equal to or higher than a threshold value is applied to the gate electrode 24, a channel is formed in the drain layer 20 right under the gate insulation film 22. The channel connects the source layer 18 and the drain layer 20. In this state, when a potential higher than the source electrode 26 is applied to the drain electrode 28, electrons flow from the source layer 18 to the drain layer 20 through the channel. In other words, the switching device 10 is turned on. In the switching device, the interface density at an interface 30 between the gate insulation film 22 and the gallium nitride semiconductor substrate 12 is lower. Therefore, the channel mobility of the switching device 10 is higher.

First Embodiment

Figure 2:
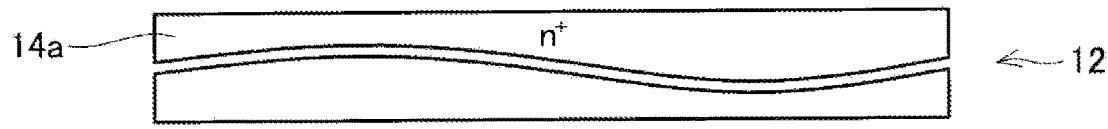
FIG. 2 illustrates a method for manufacturing the switching device.

The following describes a method for manufacturing the switching device 10 according to a first embodiment. FIG. 2 illustrates the gallium nitride semiconductor substrate 12 before processing. The switching device 10 is manufactured from the gallium nitride semiconductor substrate 12 illustrated in FIG. 2. The entire gallium nitride semiconductor substrate 12 illustrated in FIG. 2 is made of the n+ type layer 14a. The n+ type layer 14a has a thickness of about 400 micrometers (μm) and an n-type impurity concentration of about $1 \times 10^{18}$ cm$^{-3}$.

Figure 3:
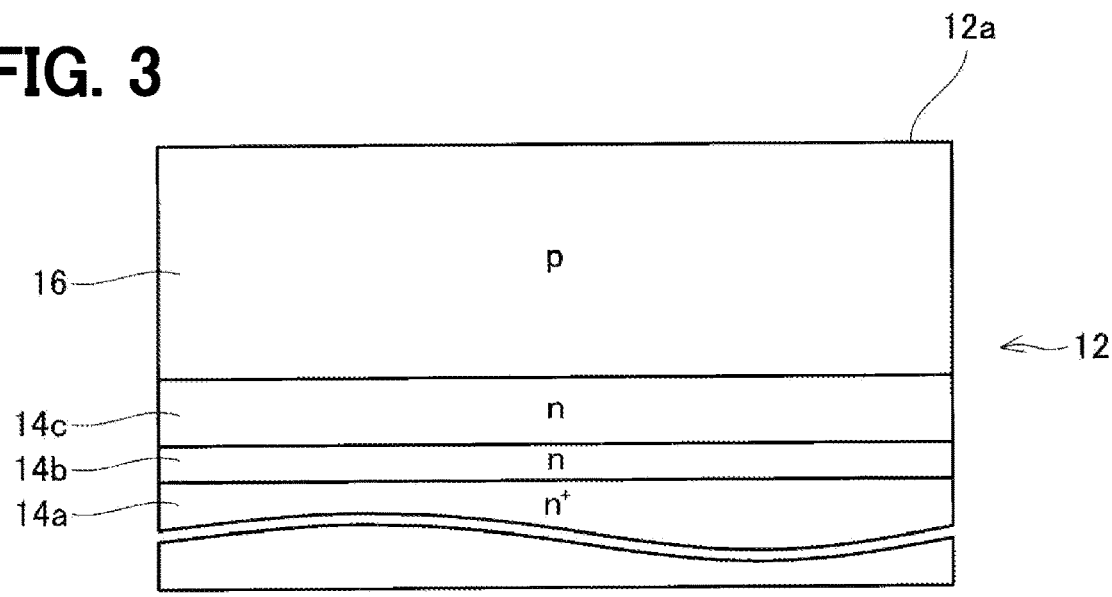
FIG. 3 illustrates the method for manufacturing the switching device.

As illustrated in FIG. 3, the buffer layer 14b made of gallium nitride is epitaxially grown above the n+ type layer 14a. The concentration of n-type impurities in the buffer layer 14b is about $2 \times 10^{16}$ cm$^{-3}$ and the buffer layer 14b has a thickness of about 0.3 μm. As illustrated in FIG. 3, the drift layer 14c made of gallium nitride is epitaxially grown above the buffer layer 14b. The drift layer 14c is formed such that the concentration of n-type impurities of the drift layer 14c is about $2 \times 10^{16}$ cm$^{-3}$ and the drift layer 14c has a thickness of about 1.0 μm. As illustrated in FIG. 3, the body layer 16 made of gallium nitride is epitaxially grown above the drift layer 14c. The body layer 16 has p-type impurities such as magnesium with a concentration of about $5 \times 10^{17}$ cm$^{-3}$, and the body layer 16 has a thickness of about 1.5 μm. The gallium nitride semiconductor substrate 12 is annealed at about 850 degree Celsius for about 5 minutes in a nitrogen atmosphere to activate the p-type impurities in the body layer 16.

Figure 4:
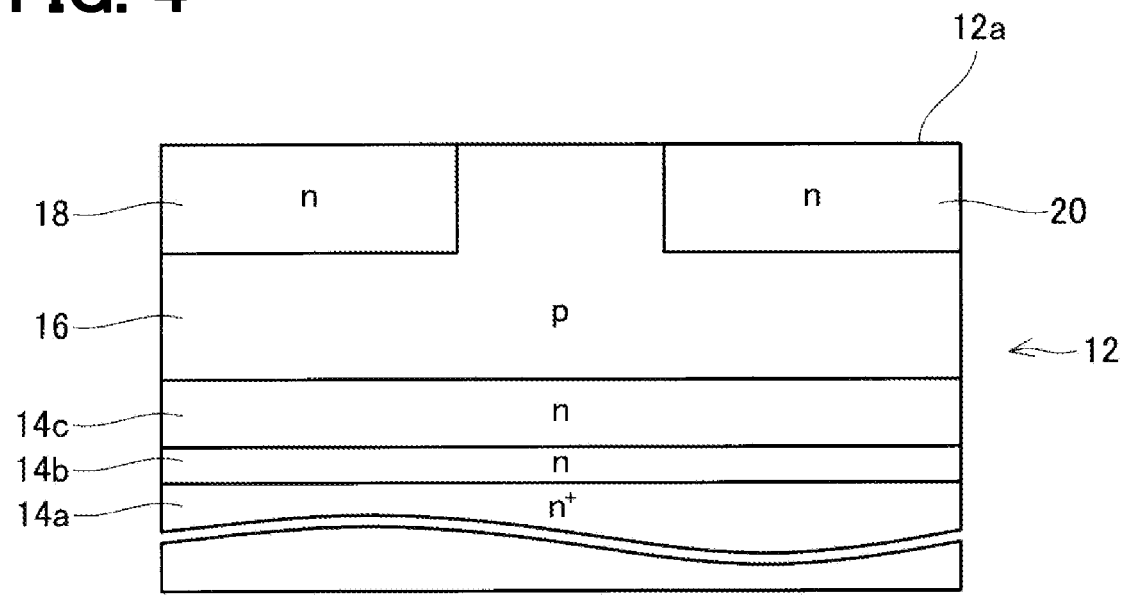
FIG. 4 illustrates the method for manufacturing the switching device.

Subsequently, n-type impurities such as silicon are selectively implanted into the body layer 16 from the top surface 12a of the gallium nitride semiconductor substrate 12 with a dose about of about $3 \times 10^{15}$ cm$^{-3}$. Subsequently, the entire gallium nitride semiconductor substrate 12 is annealed at about 1000 degree Celsius for about 5 minutes in a nitrogen atmosphere to activate the implanted n-type impurities. As illustrated in FIG. 4, the source layer 18 and the drain layer 20 are formed at a part of the surface layer portion of the body layer 16.

Figure 5:
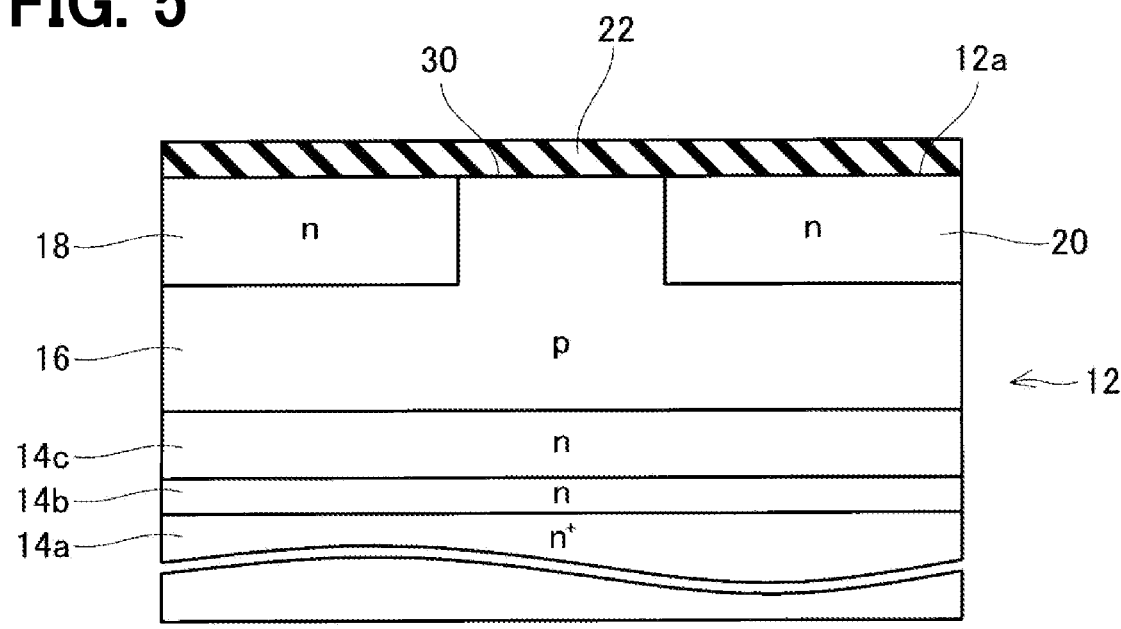
FIG. 5 illustrates a method for manufacturing the switching device.

The top surface 12a of the gallium nitride semiconductor substrate 12 is cleaned. Subsequently, formation of the gate insulation film is performed. In the formation of the gate insulation film, as illustrated in FIG. 5, the gate insulation film 22 made of silicon oxide is formed above the top surface 12a. In the gate insulation film forming step according to the first embodiment, the gate insulation film 22 is formed by a mist chemical vapor deposition (CVD) method.

Figure 6:
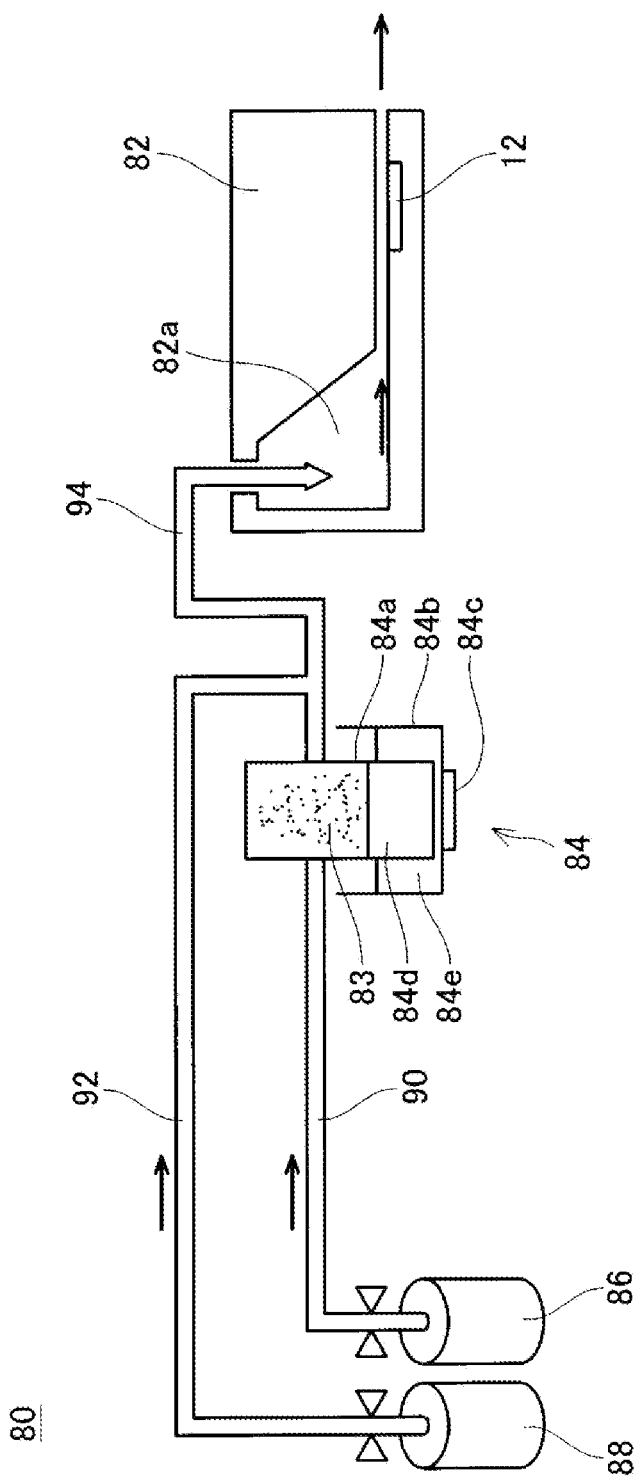
FIG. 6 illustrates a mist chemical vapor deposition (CVD) method in the first embodiment.

FIG. 6 illustrates a mist CVD apparatus 80 that executes the mist CVD method. The mist CVD apparatus 80 includes a furnace 82, a mist generator 84, a carrier gas supply source 86 and an oxidizing gas supply source 88.

The furnace 82 has a chamber 82a. It is possible to place the gallium nitride semiconductor substrate 12 inside the chamber 82a. The furnace 82 has a built-in heater and can heat the gallium nitride semiconductor substrate 12 in the chamber 82a.

The mist generator 84 includes a mist generation tank 84a, a container 85b and an ultrasonic vibrator 84c. A solution 84d is stored in the mist generation tank 84a. The solution 84d is obtained by dissolving the source material for film formation in a solvent. The source material for film formation includes silicon as an element. For example, polysilazane, tetraethoxysilane, triethoxysilane, hexamethyldisiloxane, hexamethyldisilazane, or hexamethyldisilane may be used as the source material for film formation. An organic solvent such as butyl acetate, dimethyl ether, methyl acetate, acetonitrile or dibutyl ether can be used as the solvent. The container 84b stores a liquid 84e such as water. The lower part of the mist generation tank 84a is immersed in the liquid 84e. The ultrasonic vibrator 84c is fixed to the bottom surface of the container 84b. The ultrasonic vibrator 84c applies an ultrasonic wave to the liquid 84e. The ultrasonic wave applied to the liquid 84e is transmitted to the liquid 84d inside the mist generation tank 84a through the liquid 84e. Then, the liquid surface of the solution 84d vibrates, and the mist 83 of the solution 84d is generated in the space above the solution 84d. The mist generating apparatus 84 generates the mist 83 of the solution 84d inside the mist generation tank 84a. The mist generation tank 84a is connected to the furnace 82 through a source material supply pipe 94. The mist 83 is supplied to the furnace 82 through the source material supply pipe 94 from the mist generation tank 84a. The mist 83 that has flowed through the furnace 82 to the downstream end is discharged to the outside of the furnace 82.

The carrier gas supply source 86 is connected to the mist generation tank 84a through the carrier gas supply pipe 90. The carrier gas supply source 86 supplies a carrier gas, for example, an inert gas such as argon to the mist generation tank 84a.

The oxidizing gas supply source 88 is connected to the route toward the source material supply pipe 94 through the oxidizing gas supply pipe 92. The oxidizing gas supply source 88 supplies the oxidizing gas, for example, ozone in the present embodiment, to the source material supply pipe 94.

In the formation of the gate insulation film, the gallium nitride semiconductor substrate 12 is placed in the chamber 82a of the furnace 82. The gallium nitride semiconductor substrate 12 is placed in the chamber 82a such that the top surface 12a is exposed to the mist flowing in the chamber 82a. The gallium nitride semiconductor substrate 12 is heated by the furnace 82. During the formation of the gate insulation film, the temperature of the gallium nitride semiconductor substrate 12 is maintained at about 400 degree Celsius. The ultrasonic vibrator 84c is operated to generate the mist 83 from the solution 84d. At the same time, the supply of the carrier gas to the mist generation tank 84a from the carrier gas supply source 86 is started, and the supply of the oxidizing gas from the oxidizing gas supply source 88 to the source material supply pipe 94 is started. The carrier gas that has flowed into the mist generation tank 84a from the carrier gas supply pipe 90 flows to the source material supply pipe 94 along with the mist 83 in the mist generation tank 84a. In the source material supply pipe 94, the mist 83 flows toward the furnace 82 along with the carrier gas. The oxidizing gas flows from the oxidizing gas supply pipe 92 into the source material supply pipe 94 in the route toward the source material supply pipe 94. In the portion of the source material supply pipe 94 on the downstream side of the joint part with the oxidizing gas supply pipe 92, the mist 83 flows toward the furnace 82 along with the carrier gas and the oxidizing gas. When the mist 83, the carrier gas and the oxidizing gas reach the downstream end of the source material supply pipe 94, they flow into the chamber 82a of the furnace 82. A part of the mist 83 flowing into the chamber 82a adheres to the top surface 12a of the gallium nitride semiconductor substrate 12. The solvent contained in the mist 83 adhering to the top surface 12a volatilizes, and the source material for film formation containing silicon adheres to the top surface 12a. The source material for film formation is oxidized by the oxidizing gas at the same time where the source material for film formation adheres to the top surface 12a. The oxidized source material for film formation is silicon oxide. The gate insulation film 22 made of silicon oxide grows on the top surface 12a of the gallium nitride semiconductor substrate 12. The gate insulation film 22 is formed such that the thickness of the gate insulation film 22 becomes about 100 nanometers (nm) during the film formation time about five minutes.

After the formation of the gate insulation film 22, the gallium nitride semiconductor substrate 12 is annealed at about 800 degree Celsius in a nitrogen atmosphere.

As illustrated in FIG. 1, contact holes 26a, 28a are formed in the gate insulation film 22 at the top portion of the source layer 18 and the top portion of the drain layer 20. The gate electrode 24, the source electrode 26 and the drain electrode 28 are formed. If necessary, the gallium nitride semiconductor substrate 12 is subjected to hydrogen sinter treatment. Through the above steps, the switching device 10 illustrated in FIG. 1 is completed.

In the first embodiment, the gate insulation film 22 is formed through the mist CVD method with the utilization of the oxidizing gas in a non-plasma state. The gate insulation film 22, that is, the silicon oxide film is formed by oxidizing the source material for film formation above the gallium nitride semiconductor substrate 12 through the oxidizing gas in the non-plasma state. In the manufacturing method according to the first embodiment, the oxidizing gas in the plasma state is not utilized in the formation of the gate insulation film. In the manufacturing method according to the first embodiment, the gate insulation film 22 is not exposed to the oxidizing gas in the plasma state after the formation of the gate insulation film 22. Thus, it is possible to suppress the formation of the gallium oxide layer at the interface 30 between the gate insulation film 22 and the gallium nitride semiconductor substrate 12 and enhance the channel mobility of the switching device 10.

Figure 7:
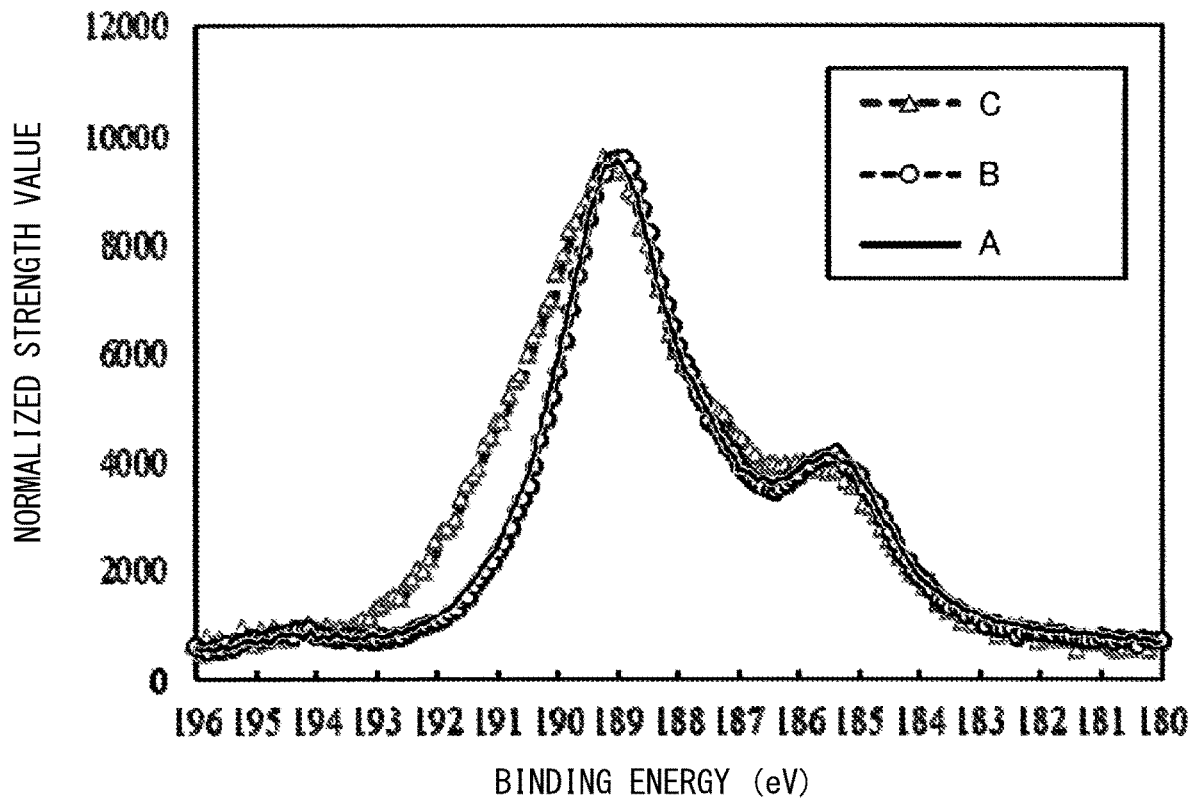
FIG. 7 is a graph showing an X-ray Photoelectron Spectroscopy (XPS) analysis results of an interface between a gate insulation film and a gallium nitride semiconductor substrate.

Graphs A to C in FIG. 7 respectively illustrate the results of XPS analysis of GaLLM for samples in which three samples were prepared as the switching device 10. Graph A is the result of XPS analysis for the surface of the body layer 16 in a state where the gate insulation film 22 is not formed as shown in FIG. 4. Graph A is the result of the XPS analysis for the surface of the body layer 16 in a state where the gallium oxide layer does not exist. Graph B is the result of the formation of the gate insulation film 22 through the formation of the gate insulation film in the first embodiment, in other words, the mist CVD method with the utilization of the ozone as the oxidizing gas, and the XPS analysis of the interface 30 between the gate insulation film 22 and the body layer 16. Graph C is the result of the formation of the gate insulation film 22 through the ALD method with the utilization of oxygen plasma, in other words, the oxygen gas in a plasma state, and the XPS analysis for the interface 30 between the gate insulation film 22 and the body layer 16. In the respective measurements of the graphs B and C, the thickness of the gate insulation film 22 is reduced from about 100 nm to about 5 nm, and then the XPS analysis is executed for the interface 30 between the gate insulation film 22 and the body layer 16.

As illustrated in FIG. 7, graph B substantially coincides with graph A, whereas graph C is obviously deviated from graph A. It is possible to detect whether or not the gallium oxide layer exists at the interface by comparing the results of the XPS analysis for the interface between the gate insulation film and the gallium nitride semiconductor. According to the above method, it is possible to detect the gallium oxide layer having a thickness larger than 1 nm. As described above, graph A is the result of the XPS analysis for the surface of the body layer 16 in a state where the gallium oxide layer does not exist. Since graph B coincides with graph A in the sample of graph B, the gallium oxide layer does not exist at the interface 30, or the thickness of the gallium oxide layer existing at the interface 30 is 1 nm or smaller, which is below the detectable boundary. When the gate insulation film 22 is formed by the mist CVD method using ozone as the oxidizing gas, the gallium oxide layer is not formed at the interface 30, or the thickness of the gallium oxide layer formed at the interface 30 is 1 nm or smaller. Since graph C is obviously deviated from graph A, in the sample of graph C, the gallium oxide layer with a thickness larger than 1 nm exists at the interface 30. In a situation where the gate insulation film 22 is formed by the ALD method with the utilization of the oxygen plasma, the gallium oxide layer having a thickness larger than 1 nm is formed at the interface 30.

According to the manufacturing method in the first embodiment, it is possible to suppress the formation of the gallium oxide layer at the interface 30. The reason is described in the following. If the oxidizing gas in the plasma state is used when the gate insulation film 22 is formed, the oxidation level of the oxidizing gas in the plasma state is excessively high. Therefore, the surface of the gallium nitride semiconductor substrate 12 is oxidized and the gallium oxide layer is formed at the interface 30. In contrast, in the manufacturing method according to the first embodiment, the oxidizing gas in the non-plasma state is used when the gate insulation film 22 is formed. Since the oxidation level of the oxidizing gas in the non-plasma state is not relatively high, the formation of the gallium oxide layer at the interface 30 is suppressed. When the gate insulation film 22 is exposed to the oxidizing gas in the plasma state after the formation of the gate insulation film 22, the gallium oxide layer is formed at the interface 30. The manufacturing method according to the first embodiment is without the exposure of the gate insulation film 22 the oxidizing gas in the plasma state after the formation of the gate insulation film 22. Therefore, the formation of the gallium oxide layer at the interface 30 after the formation of the gate insulation film 22 is suppressed. According to the manufacturing method in the first embodiment, it is possible to manufacture the switching device 10 in which the gallium oxide layer does not exist at the interface 30 or the thickness of the gallium oxide layer being equal to or smaller than 1 nm.

Figure 8:
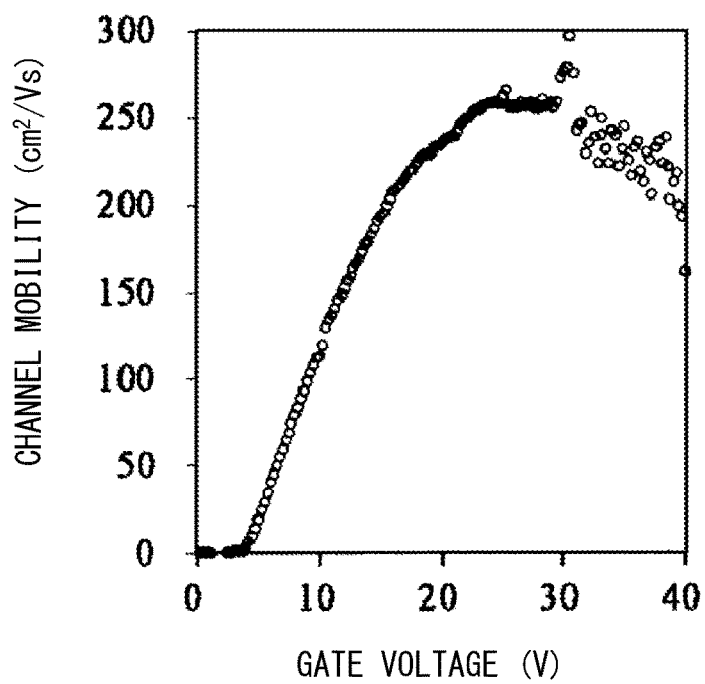
FIG. 8 is a graph that illustrates the mobility of the switching device manufactured by the manufacturing method.
Figure 9:
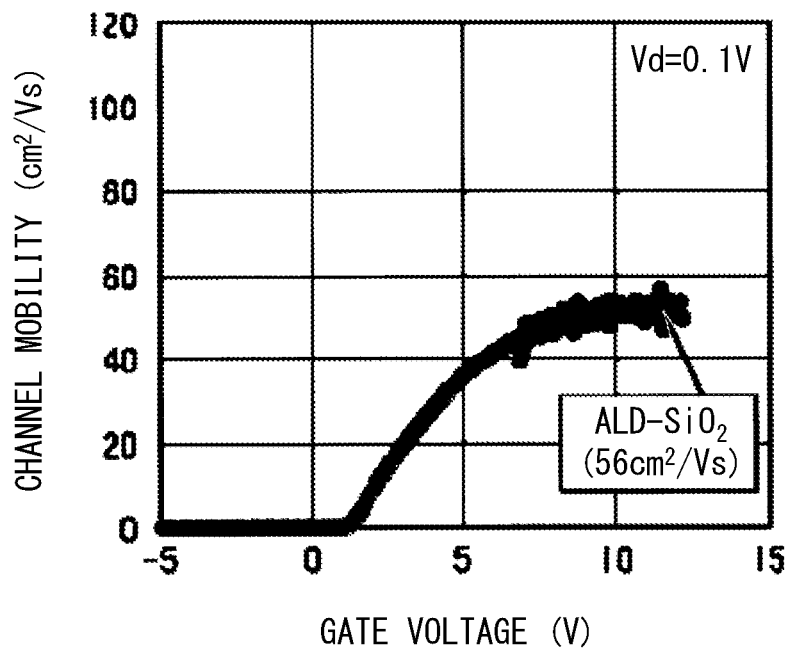
FIG. 9 is a graph that illustrates the mobility of the switching device manufactured by the manufacturing method with the utilization of oxygen plasma.

When the formation of the gallium oxide layer at the interface 30 is suppressed, it is possible to reduce the interface state density at the interface 30. In the switching device 10, since the channel is formed along the interface, it is possible to enhance the channel mobility by reducing the interface state density at the interface 30. FIG. 8 illustrates the result obtained by the measurement of the channel mobility of the switching device 10 manufactured by the method according to the first embodiment. As illustrated in FIG. 8, the mobility exceeding 250 $cm^2Ns$ was acquired. FIG. 9 illustrates the result obtained by the measurement of the channel mobility of the switching device 10 in a situation where the gate insulation film 22 is formed by the ALD method with the utilization of oxygen plasma. As illustrated in FIG. 9, in this situation, the mobility was about 56 $cm^2Ns$.

According to the manufacturing method described in the first embodiment, it is possible to suppress the formation of the gallium oxide layer at the interface 30 and manufacture the switching device 10 with higher channel mobility.

The following describes respective manufacturing methods according to second to fifth embodiments. In the respective manufacturing methods according to the second to fifth embodiments, only the formation of the gate insulation film is different from the one described in the first embodiment. The following describes the formation of the gate insulation film in each of the second to fifth embodiments.

Second Embodiment

Figure 10:
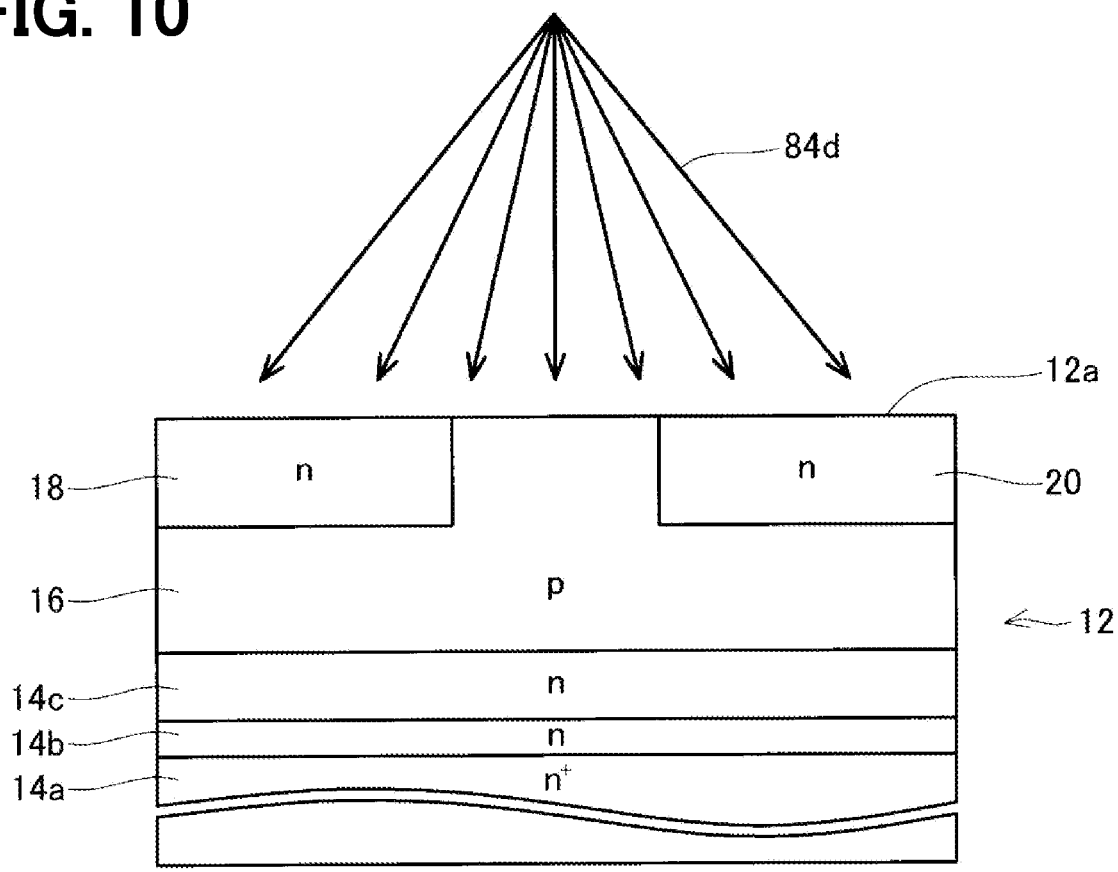
FIG. 10 illustrates a spray method in the second embodiment.

In the formation of the gate insulation film according to the second embodiment, the gate insulation film 22 is formed by a spray coating method. As illustrated in FIG. 10, the solution 84d is spray-coated at the top surface 12a of the gallium nitride semiconductor substrate 12 while heating the gallium nitride semiconductor substrate 12. At the same time, the oxidizing gas, for example, ozone is supplied to the top surface 12a of the gallium nitride semiconductor substrate 12. The solvent volatilizes from the solution 84d adhering to the top surface 12a, and the source material for film formation containing silicon adheres to the top surface 12a. The source material for film formation is oxidized by the oxidizing gas at the same time where the source material for film formation adheres to the top surface 12a. The oxidized source material for film formation is silicon oxide. The gate insulation film 22 made of silicon oxide grows on the top surface 12a of the gallium nitride semiconductor substrate 12.

Third Embodiment

Figure 11:
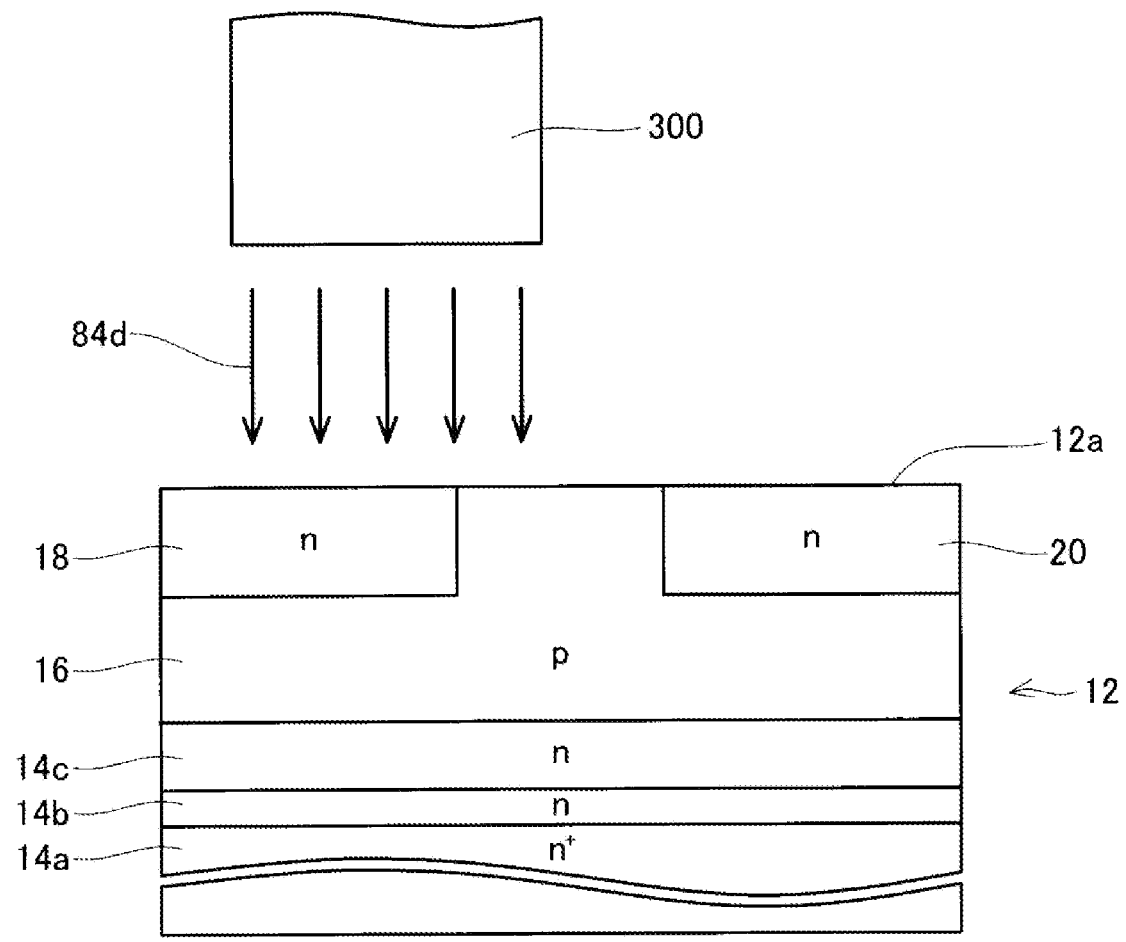
FIG. 11 illustrates an inkjet method in the third embodiment.

In the formation of the gate insulation film according to the third embodiment, the gate insulation film 22 is formed by an inkjet method. As illustrated in FIG. 11, the droplets of the solution 84d is discharged toward the top surface 12a of the gallium nitride semiconductor substrate 12 while heating the gallium nitride semiconductor substrate 12. At the same time, the oxidizing gas, for example, ozone is supplied to the top surface 12a of the gallium nitride semiconductor substrate 12. The solvent volatilizes from the solution 84d adhering to the top surface 12a, and the source material for film formation containing silicon adheres to the top surface 12a. The source material for film formation is oxidized by the oxidizing gas at the same time where the source material for film formation adheres to the top surface 12a. The oxidized source material for film formation is silicon oxide. The gate insulation film 22 made of silicon oxide grows on the top surface 12a of the gallium nitride semiconductor substrate 12.

Fourth Embodiment

Figure 12:
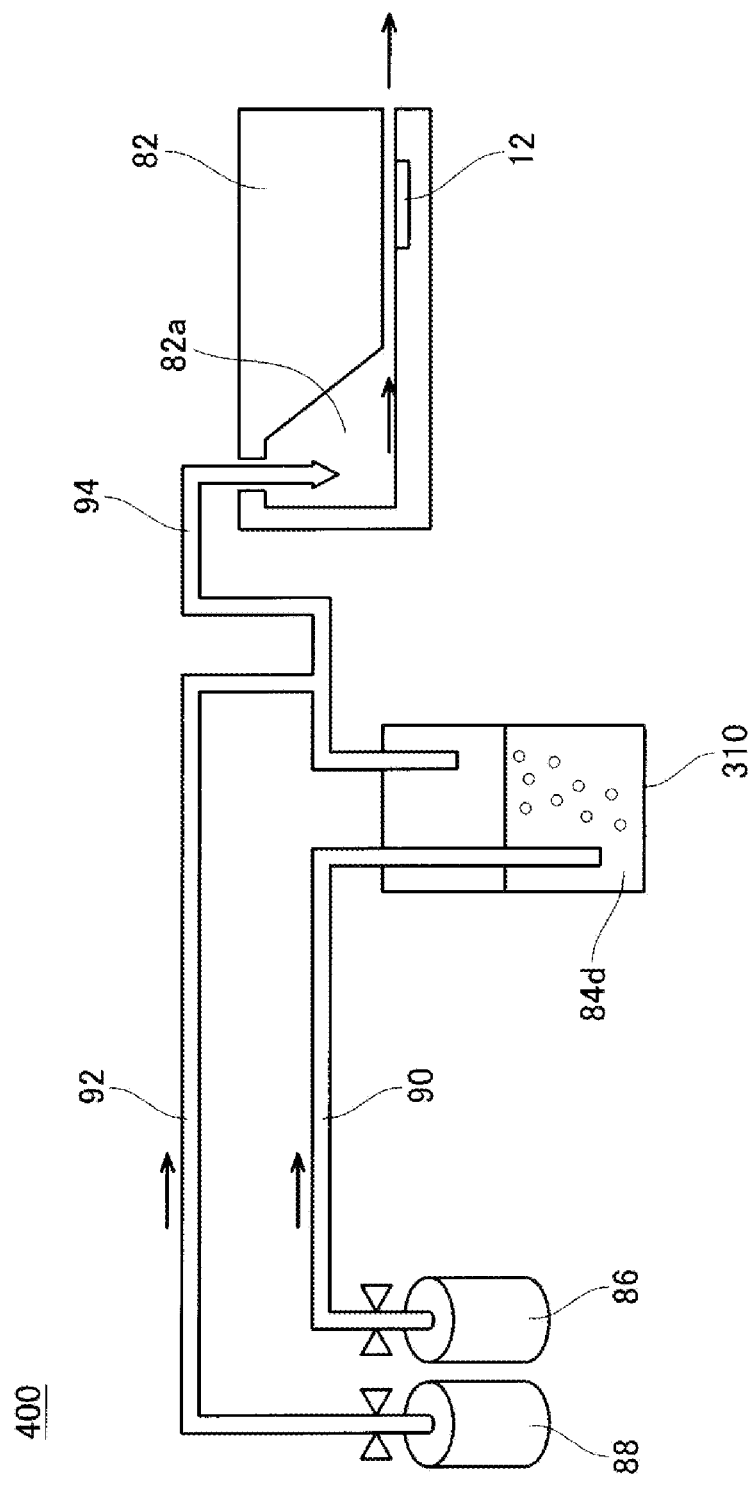
FIG. 12 illustrates a bubbling method in the fourth embodiment.

In the formation of the gate insulation film according to the fourth embodiment, the gate insulation film 22 is formed by a bubbling method. FIG. 12 shows a bubbling film forming apparatus 400 used in the bubbling method. The bubbling film forming apparatus 400 replaces the mist generator 84 in the mist CVD apparatus 80 in FIG. 6 with a bubbling tank 310. The solution 84d is stored in the mist generation tank 84a. The downstream end of the carrier gas supply pipe 90 is immersed in the solution 84d in the bubbling tank 310. The upstream end of the source material supply pipe 94 is arranged in the bubbling tank 310 above the liquid level of the solution 84d. In a situation where the gate insulation film 22 is formed by the bubbling film forming apparatus 400, the oxidizing gas, for example, ozone is supplied to the oxidizing gas supply pipe 92 from the oxidizing gas supply source 88 and the carrier gas is supplied to the carrier gas supply pipe 90 from the carrier gas supply source 86, while heating the gallium nitride semiconductor substrate 12. The carrier gas supplied to the bubbling tank 310 passes through the solution 84 as bubbles. As a result, droplets of the solution 84d are generated in the carrier gas. The droplets of the solution 84d are supplied to the top surface 12a of the gallium nitride semiconductor substrate 12 in the furnace 82 together with the carrier gas and the oxidizing gas. When the droplets of the solution 84d adheres to the top surface 12a, the solvent volatilizes from the solution 84d and the source material for film formation containing the silicon adheres to the top surface 12a. The source material for film formation is oxidized by the oxidizing gas at the same time where the source material for film formation adheres to the top surface 12a. The oxidized source material for film formation is silicon oxide. The gate insulation film 22 made of silicon oxide grows on the top surface 12a of the gallium nitride semiconductor substrate 12.

The respective manufacturing methods in the second to fourth embodiments are similar to the first embodiment such that the source material for film formation is dissolved and the solution 84d including the solvent is supplied to the surface 12a of the heated gallium nitride semiconductor substrate 12. In each of the respective manufacturing methods in the second to fourth embodiments, the oxidizing gas in the non-plasma state is used and the gate insulation film 22 is formed. The respective manufacturing methods are without the exposure of the gate insulation film 22 to the oxidizing gas in the plasma state after the formation of the gate insulation film 22. In any of the respective manufacturing methods in the second to fourth embodiments, it is possible to suppress the formation of the gallium oxide layer at the interface 30 between the gate insulation film 22 and the body layer 16. It is possible to manufacture the switching device 10 with higher channel mobility in any of the respective manufacturing methods according to the second to fourth embodiments.

Fifth Embodiment

Figure 13:
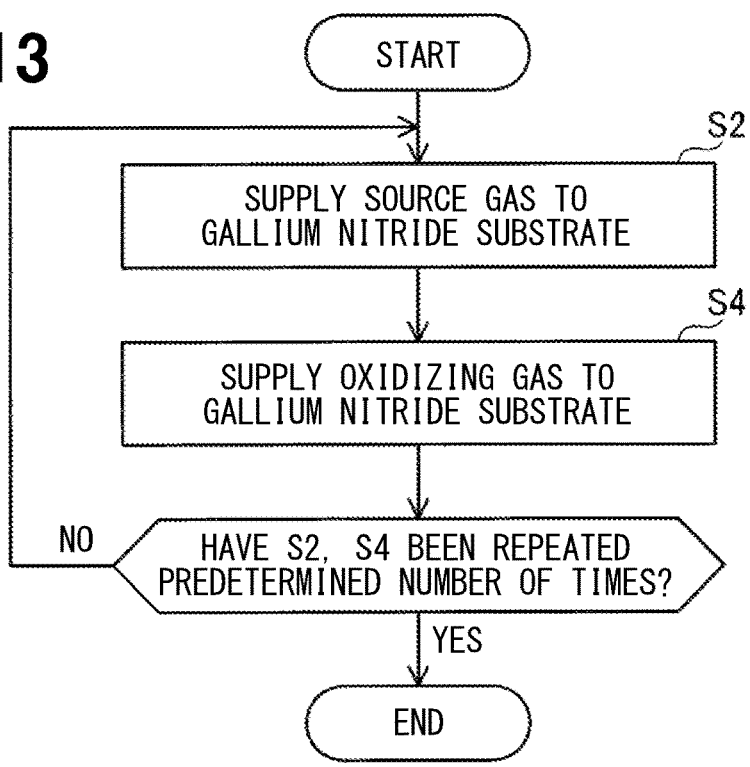
FIG. 13 illustrates an atomic layer deposition (ALD) method with the utilization of oxidizing gas in a non-plasma state in the fifth embodiment.

In the formation of the gate insulation film according to the fifth embodiment, the gate insulation film 22 is formed by the oxidizing gas in the non-plasma state. In the formation of the gate insulation film, S2 and S4 are alternately repeated multiple times as illustrated in FIG. 13. In S2, source gas having silicon as an element is supplied to the top surface 12a of the gallium nitride semiconductor substrate 12 while heating the gallium nitride semiconductor substrate 12. As a result, the source material having silicon is deposited at the top surface 12a of the gallium nitride semiconductor substrate 12. In S4, the oxidizing gas, for example, ozone in the present embodiment is supplied to the top surface 12a of the gallium nitride semiconductor substrate 12 while heating the gallium nitride semiconductor substrate 12. As a result, the source material having silicon deposited at the top surface 12a of the gallium nitride semiconductor substrate 12 is oxidized and becomes silicon oxide. By repeating S2 and S4, the gate insulation film, in other words, silicon oxide film grows at the top surface 12a of the gallium nitride semiconductor substrate 12. In the manufacturing methods the fifth embodiment, the oxidizing gas in the non-plasma state is used and the gate insulation film 22 is formed. The manufacturing method in the fifth embodiment is without the exposure of the gate insulation film 22 to the oxidizing gas in the plasma state after the formation of the gate insulation film 22. In any of the manufacturing method in the fifth embodiment, it is possible to suppress the formation of the gallium oxide layer at the interface 30 between the gate insulation film 22 and the body layer 16. It is possible to manufacture the switching device 10 with higher channel mobility in any of the manufacturing method according to the fifth embodiment. However, it takes ten or more hours to form a 100-nm film since this method is theoretically a film forming method at an atomic level. In a method for film formation through the CVD, it is considered that the film formation time is about several tens of minutes. In the ALD method, even if the oxidizing gas in the plasma state is not used, since the gallium oxide film is formed at the interface 30 during the film formation for a long time, it is effective for the film formation with 10 nm or smaller in the fifth embodiment.

(First Modification)

Figure 14:
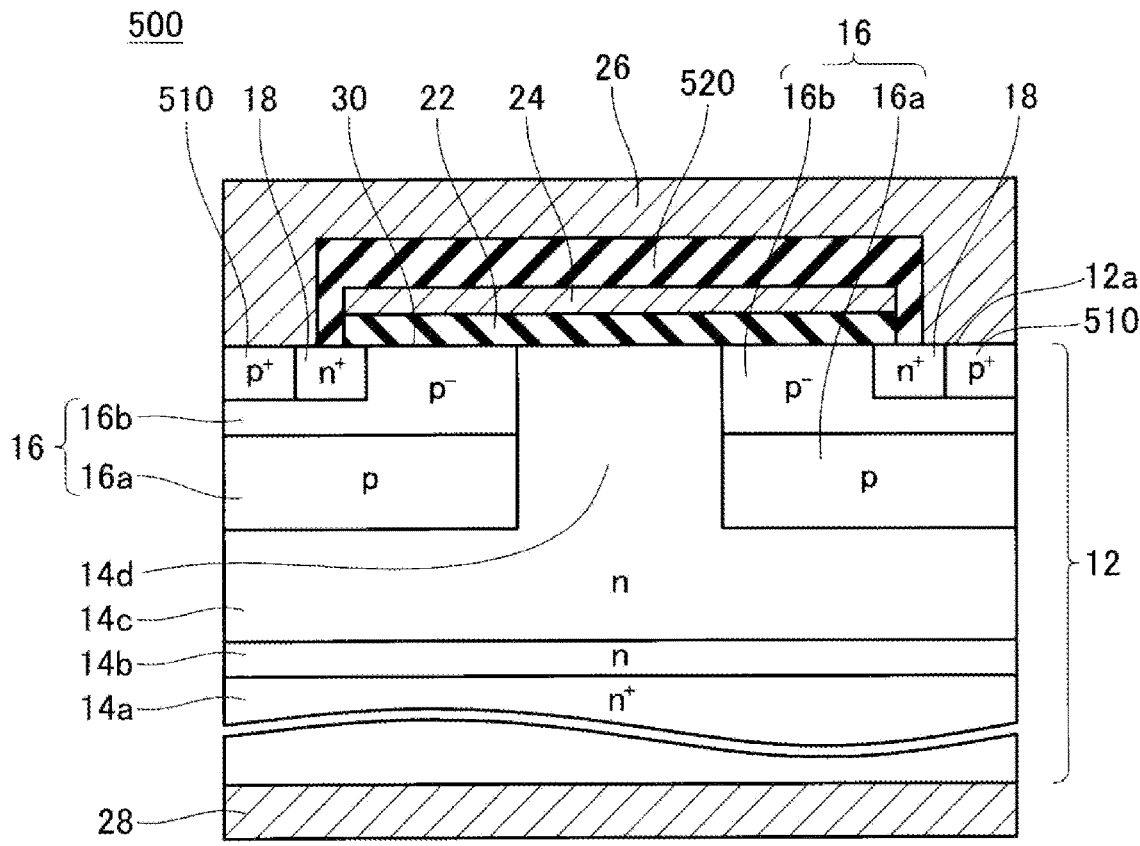
FIG. 14 is a cross-sectional view of a switching device according to a first modification.

The following describes a switching device 500 according to a first modification illustrated in FIG. 14. The switching device 500 is a MOSFET with a vertical structure. The parts in the switching device 500 having the same functions as the switching device 10 are denoted by the same reference numbers as those of the switching device 10.

As illustrated in FIG. 14, the gallium semiconductor substrate 12 in the switching device 500, as similar to the switching device 10, includes the n$^+$ type layer 14a, the buffer layer 14b and the drift layer 14c. Multiple body layers 16 are arranged above the drift layer 14c. The body layers 16 are provided in a range partially including a top surface 12a of the gallium nitride semiconductor substrate 12. The top surface 12a of the semiconductor substrate 12 may also be referred to as a top surface of the semiconductor substrate 12. The body layers 16 are separated from each other. The drift layer 14c is provided between two body layers 16, and two body layers 16 are separated from each other by the drift layer 14c. In the following, the drift layer 14c located between two body layers 16 is referred to as a junction field effect transistor layer (JFET layer) 14d. Each of the body layers 16 includes a p-type high concentration layer 16a and a p-type low concentration layer 16b having a lower concentration of p-type impurities than the p-type high concentration layer 16a. In the following, the p-type high concentration layer 16a may be also referred to as a p$^+$ type layer 16a, and the p-type low concentration layer 16b may also be referred to as a p-type layer 16b. The p$^+$ type layer 16a is in contact with the drift layer 14c from above. The p-type layer 16b is in contact with the p$^+$ type layer 16a from above. The source layer 18 and a contact layer 510 are provided in a region surrounded by the p-type layer 16b. Each of the source layers 18 is provided in a region partially including the top surface 12a. Each of the source layers 18 is separated from the drift layer 14c by the body layer 16. Each contact layer 510 is a p-type layer having a higher concentration of p-type impurities than the p$^+$ type layer 16a. Each contact layer 510 is provided in a region partially including the top surface 12a.

The gate insulation film 22, the gate electrode 24, the source electrode 26 and an interlayer insulation film 520 are arranged at a top portion of the gallium nitride semiconductor substrate 12. The gate insulation film 22 covers a part of the top surface 12a of the gallium nitride semiconductor substrate 12. The gate insulation film 22 covers a region straddling the surface of the source layer 18 as a part of the top surface 12a, the surface of the p-type layer 16b as a part of the top surface 12a, and the surface of the JFET 14d as a part of the top surface 12a. The gate electrode 24 is arranged above the gate insulation film 22. The gate electrode 24 faces the source layer 18, the body layer 16 and the JFET layer 14d with the gate insulation film 22 sandwiched therebetween. The top portion of the gate electrode 24 is covered by the interlayer insulation film 520. The source electrode 26 covers the interlayer insulation film 520 and is in ohmic contact with the source layer 18 and the contact layer 510. The drain electrode 28 is provided at the lower surface of the gallium nitride semiconductor substrate 12. The drain electrode 28 is in ohmic contact with the n$^+$ type layer 14a.

When a potential equal to or higher than a threshold value is applied to the gate electrode 24, a channel is formed in the p-type layer 16b right under the gate insulation film 22. The channel connects the source layer 18 and the JFET layer 14d. In this state, when a potential higher than the source electrode 26 is applied to the drain electrode 28, electrons flow from the source layer 18 to n$^+$ type layer 14a through the channel, drift layer 14c and the buffer layer 14b. In other words, the switching device 500 is turned on.

The switching device 500 is manufactured from the gallium nitride semiconductor substrate 12 illustrated in FIG. 2. The entire gallium nitride semiconductor substrate 12 is made of the n$^+$ type layer 14a.

Figure 15:
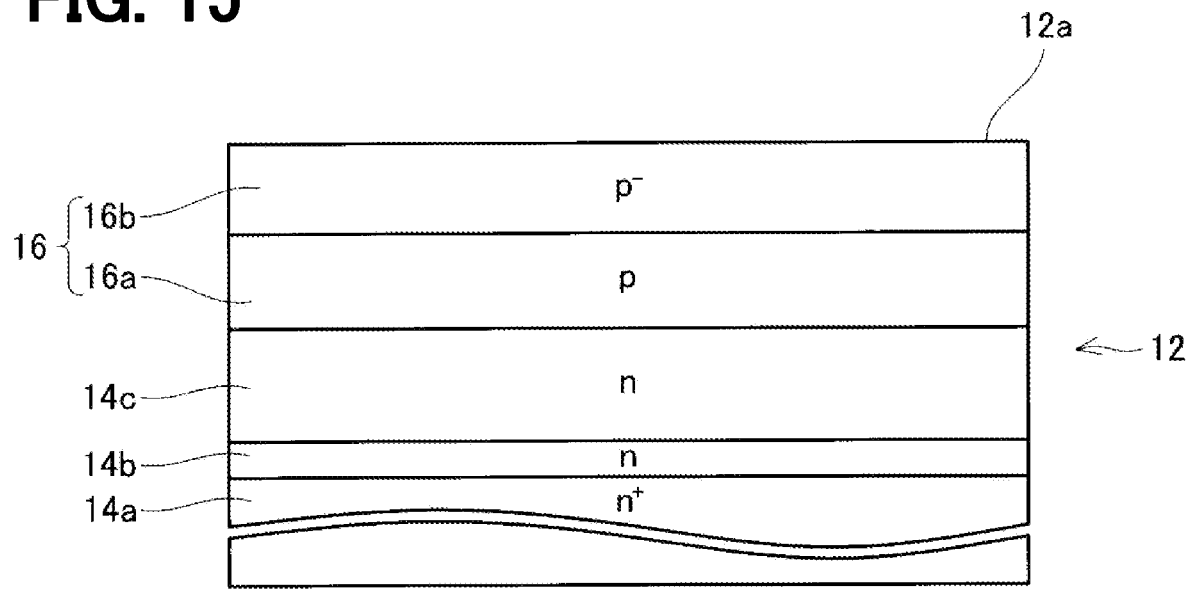
FIG. 15 illustrates a method for manufacturing the switching device according to the first modification.
Figure 16:
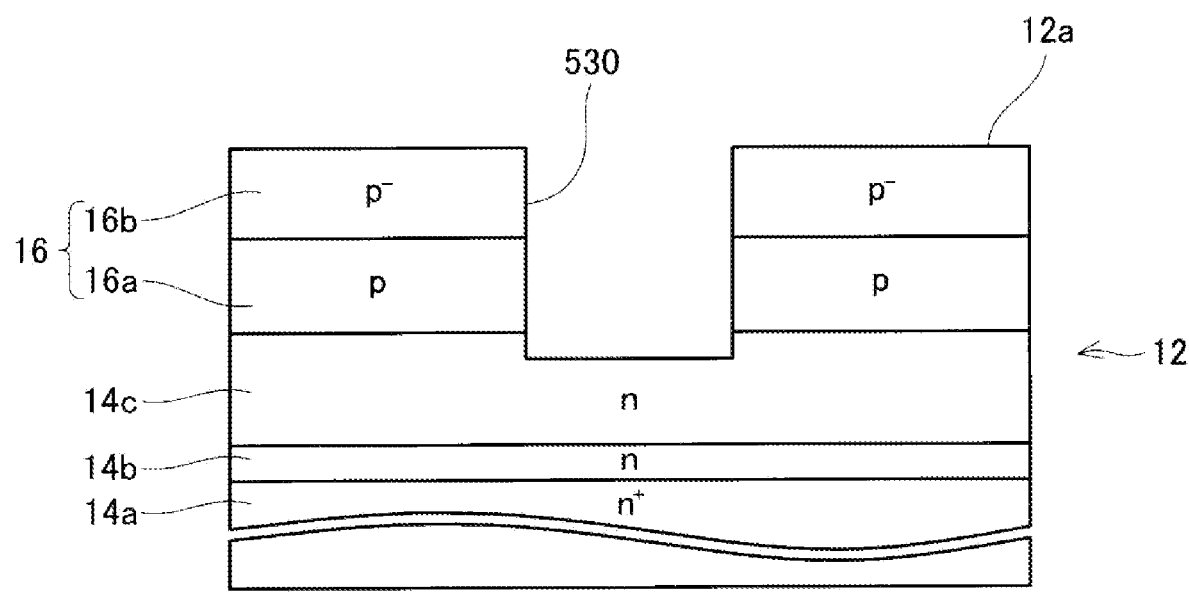
FIG. 16 illustrates a method for manufacturing the switching device according to the first modification.

As illustrated in FIG. 15, the buffer layer 14b made of gallium nitride is epitaxially grown above the n$^+$ type layer 14a. The buffer layer 14b is formed such that the concentration of n-type impurities in the buffer layer 14b is about $2\times10^{16}$ cm$^{-3}$ and the buffer layer 14b has a thickness of about 0.3 μm. As illustrated in FIG. 15, the drift layer 14c made of gallium nitride is epitaxially grown above the buffer layer 14b. The concentration of n-type impurities of the drift layer 14c is about $2\times10^{16}$ cm$^{-3}$ and the drift layer 14c has a thickness of about 5.0 μm. As illustrated in FIG. 16, the body layer 16 made of gallium nitride is epitaxially grown above the p$^+$ type layer 16a. The p$^+$ type layer 16a is formed such that the concentration of p-type impurities of the p$^+$ type layer 16a is about $5\times10^{19}$ cm$^{-3}$ and the p$^+$ type layer 16a has a thickness of about 0.5 μm. As illustrated in FIG. 15, the p-type layer 16b made of gallium nitride is epitaxially grown above the p$^+$ type layer 16a. The concentration of p-type impurities of the p$^+$ type layer 16a is about $5\times10^{17}$ cm$^{-3}$ and the p-type layer 16b has a thickness of about 1.5 μm. Subsequently, the gallium nitride semiconductor substrate 12 is annealed at about 850 degree Celsius for about 5 minutes in a nitrogen atmosphere to activate the impurities in the gallium nitride semiconductor substrate 12.

As illustrated in FIG. 16, a recess 530 is formed at the top surface 12a by selectively dry etching the top surface 12a of the top surface 12a of the gallium nitride semiconductor substrate 12 by using an etching mask. The recess 530 may also be referred to as a concave portion. The width of the recess 530 is about 4 μm and the depth of the recess 530 reaches the drift layer 14c.

Figure 17:
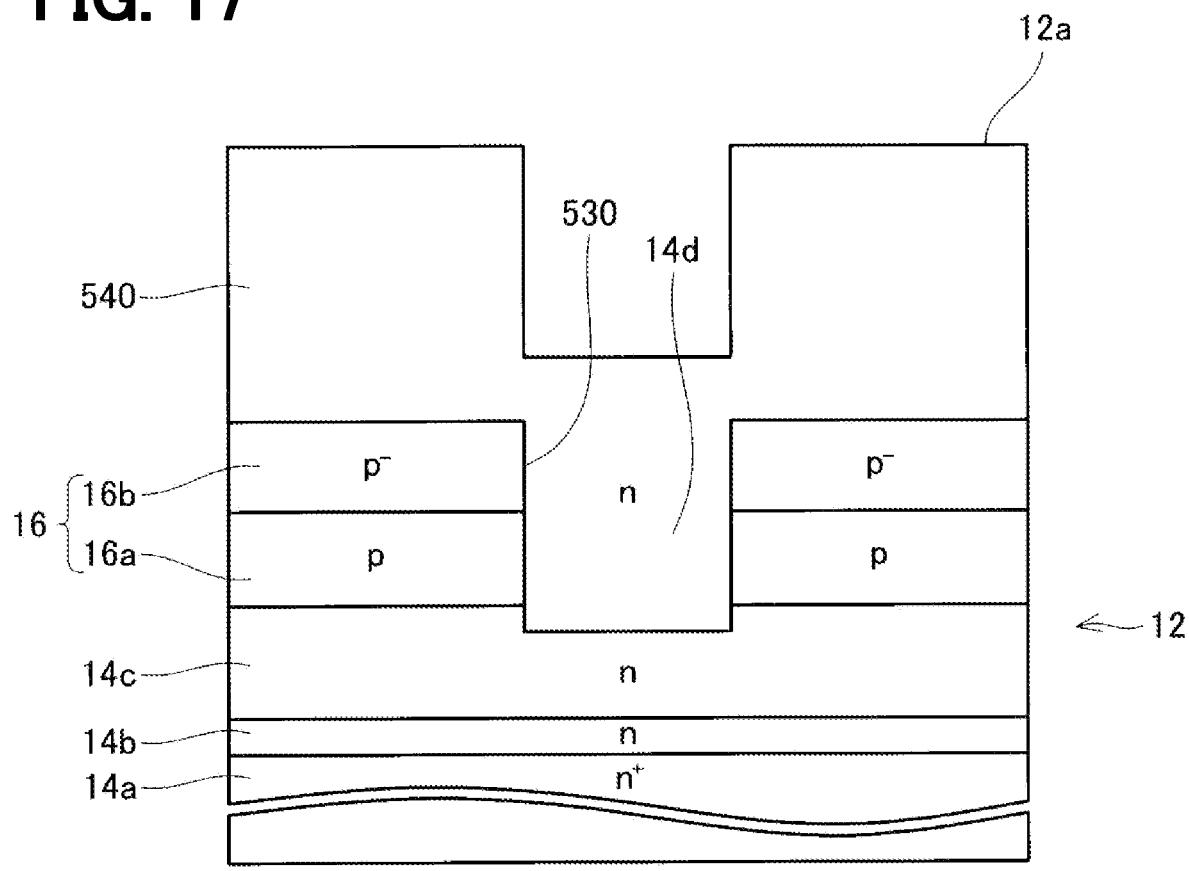
FIG. 17 illustrates a method for manufacturing the switching device according to the first modification.

As illustrated in FIG. 17, an n-type layer 540 is epitaxially grown above the gallium nitride semiconductor substrate 12. The concentration of n-type impurities of the n-type layer 540 is about $2\times10^{16}$ cm$^{-3}$ and the n-type layer 540 has a thickness of about 3.0 μm. When the n-type layer 540 is formed as described above, the recess 530 is filled with the n-type layer 540. The JFET layer 14d is formed by the n-type layer 540 in the recess 530.

Figure 18:
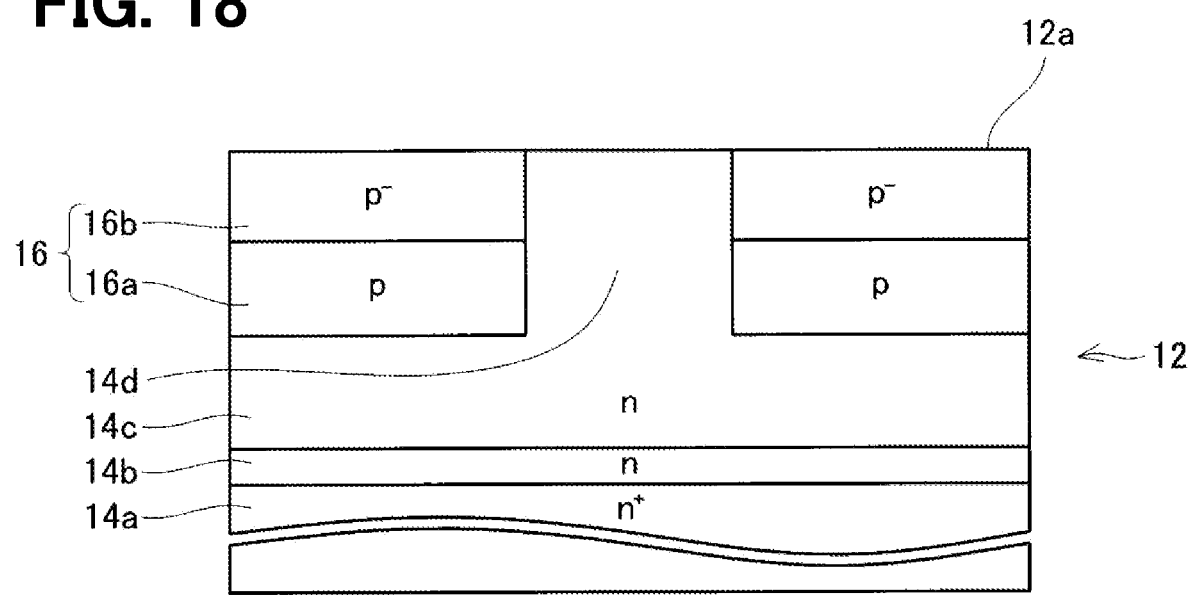
FIG. 18 illustrates a method for manufacturing the switching device according to the first modification.

As illustrated in FIG. 18, the top surface 12a of the gallium nitride semiconductor substrate 12 by chemical mechanical polishing (CMP). The top surface 12a is flattened such that the p-type layer 16b is exposed at the top surface 12a.

Figure 19:
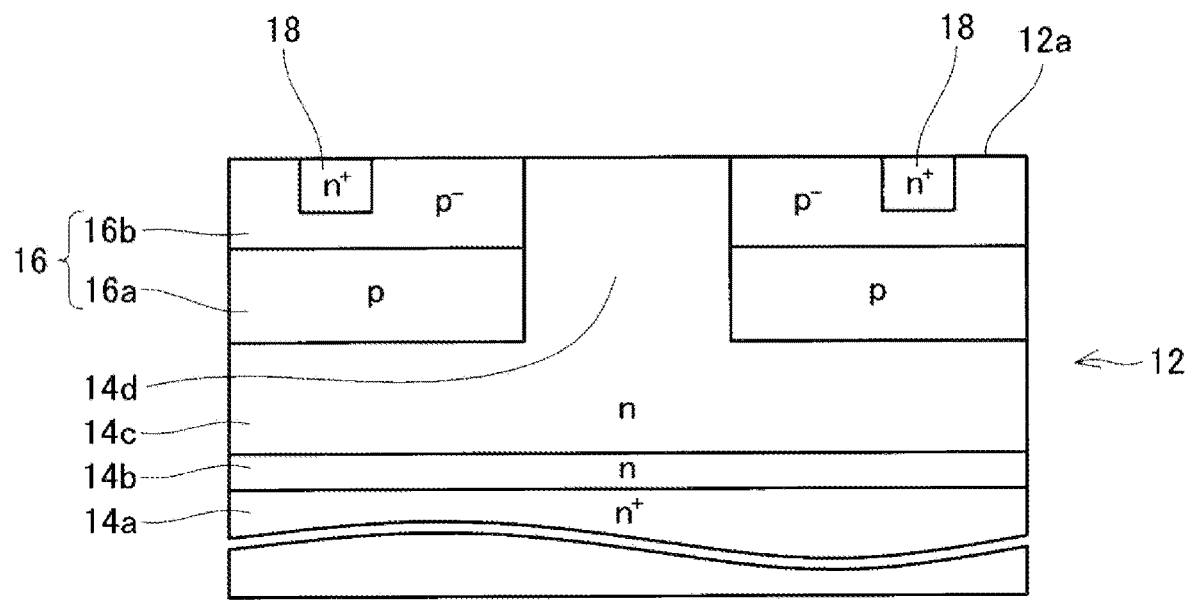
FIG. 19 illustrates a method for manufacturing the switching device according to the first modification.

Subsequently, n-type impurities such as silicon are selectively implanted into the p-type layer 16b from the top surface 12a of the gallium nitride semiconductor substrate 12 with a dose about of about $3 \times 10^{15}$ cm$^{-3}$. The entire gallium nitride semiconductor substrate 12 is annealed at about 1000 degree Celsius for about 5 minutes in a nitrogen atmosphere to activate the implanted n-type impurities. As illustrated in FIG. 19, the source layer 18 is formed at a part of the surface layer portion of the p-type layer 16b.

Figure 20:
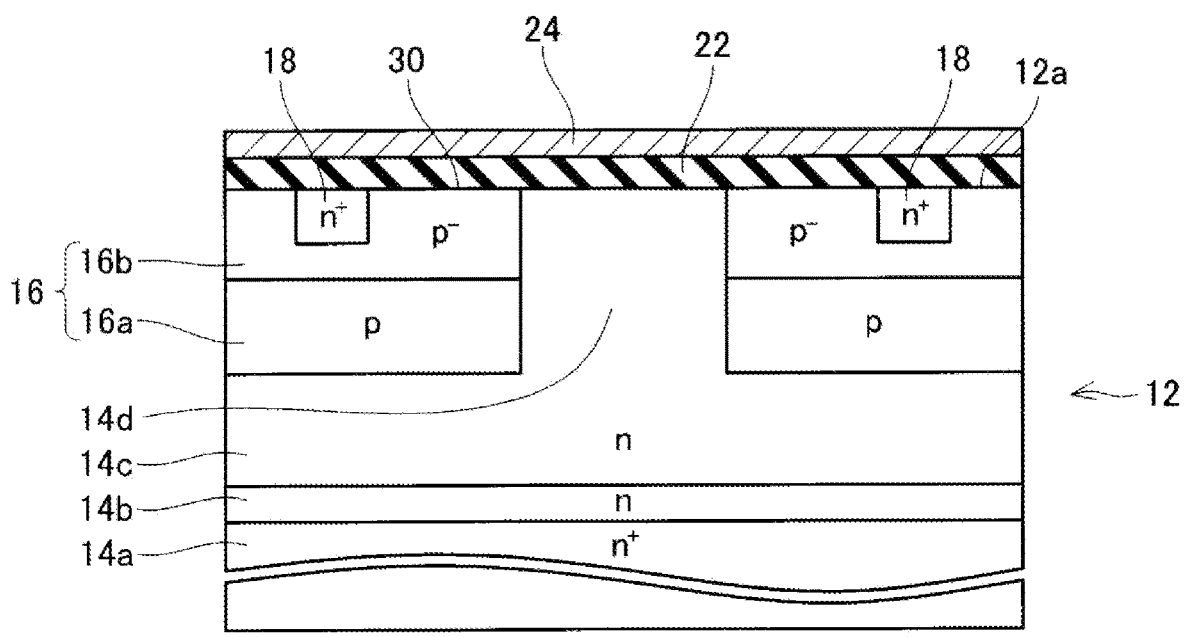
FIG. 20 illustrates a method for manufacturing the switching device according to the first modification.

The gate insulation film 22 made of silicon oxide is formed above the top surface 12a of the gallium nitride semiconductor substrate 12, as illustrated in FIG. 20. The gate insulation film 22 is formed to cover the entire top surface 12a. It is possible to form the gate insulation film 22 through the formation of the gate insulation film in any one of the first to fifth embodiments. The formation of the gallium oxide layer at the interface 30 between the gate insulation film 22 and the gallium nitride semiconductor substrate 12 is suppressed.

As illustrated in FIG. 20, the gate electrode 24 is formed above the gate insulation film 22. The gate electrode 24 is formed to cover the entire top surface of the gate insulation film 22.

Figure 21:
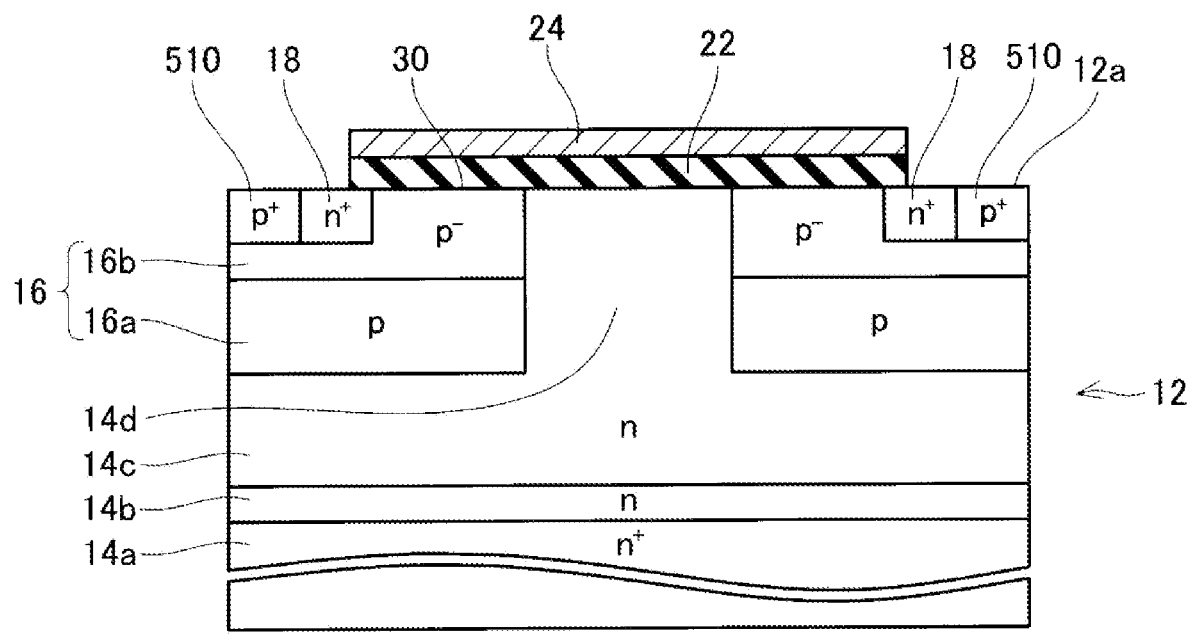
FIG. 21 illustrates a method for manufacturing the switching device according to the first modification.

As illustrated in FIG. 21, the source layer 18 and a part of the p-type layer 16b are exposed by partially removing the gate insulation film 22 and the gate electrode 24. Subsequently, p-type impurities are ion-implanted into the p-type layer 16b, and then the contact layer 510 is formed by performing activation annealing, as illustrated in FIG. 21. The switching device 500 as illustrated in FIG. 14 is completed by forming the interlayer insulation film 520 and the source electrode 26 at the top portion of the gallium nitride semiconductor substrate 12 and forming the drain electrode 28 at the lower part of the gallium nitride semiconductor substrate 12.

The gate insulation film 22 of the switching device 500 according to the first modification is formed by the formation of the gate insulation film described in any one of the first to fifth embodiments. The formation of the gallium oxide layer at the interface 30 between the gate insulation film 22 and the gallium nitride semiconductor substrate 12 is suppressed. In the switching device 500 according to the first modification, the gallium oxide layer does not exist at the interface 30 or the thickness of the gallium oxide layer being equal to or smaller than 1 nm. In the switching device 500 according to the first modification, the interface state density at the interface 30 is lower. Therefore, the channel mobility of the switching device 500 according to the first modification is higher.

(Second Modification)

Figure 22:
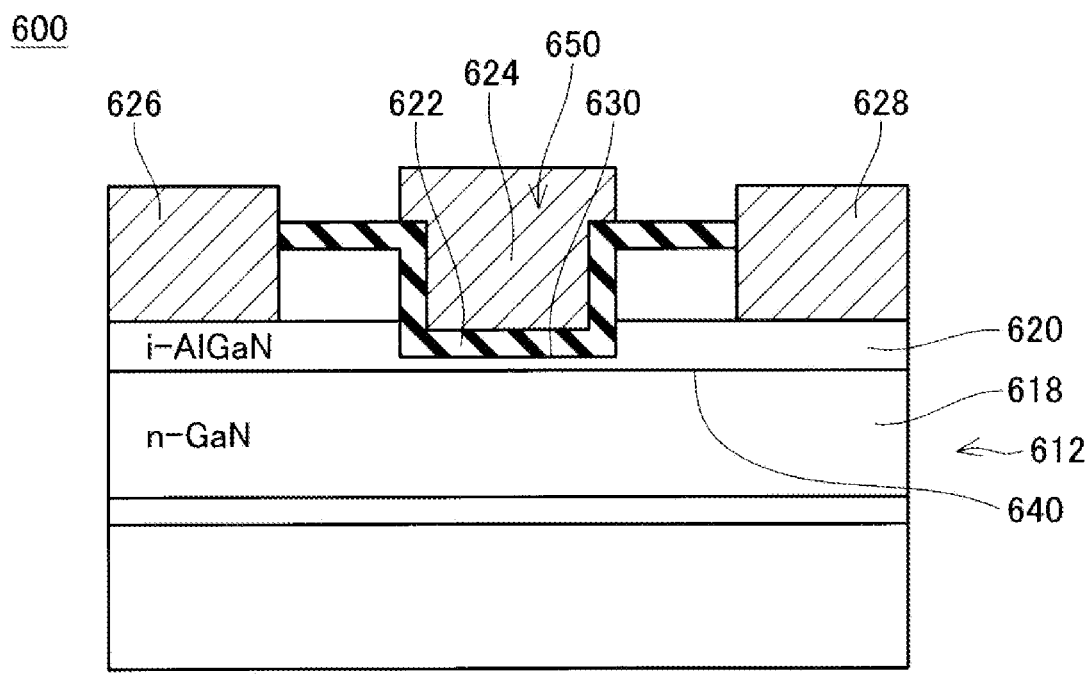
FIG. 22 is a cross-sectional view of a switching device according to a second modification.

Each of the switching devices 10, 500 is a MOSFET. Alternatively, the techniques disclosed in the present disclosure may be applied to other switching devices. For example, the techniques disclosed herein may be applied to a high electron mobility transistor (HEMT). FIG. 22 illustrates a switching device 600 according to a second modification as an example of the HEMT. As illustrated in FIG. 22, a gallium nitride semiconductor substrate 612 includes a carrier travel layer 618 and a carrier supply layer 620. The carrier travel layer 618 is made of n-type gallium oxide (that is, n-GaN). The carrier supply layer 620 is provided above the carrier travel layer 618. The carrier supply layer 620 is made of i-type aluminum nitride (that is, i-AlGaN). An interface 640 between the carrier travel layer 618 and the carrier supply layer 620 is a heterojunction surface, and two-dimensional electron gas is generated along the interface 640. A recess 650 is provided at the top surface of the carrier supply layer 620, and the gate insulation film 622 and the gate electrode 624 are provided inside the recess 650. The gate electrode 624 faces the carrier supply layer 620 with the gate insulation film 622 sandwiched therebetween. At the top surface of the gallium nitride semiconductor substrate 612, the source electrode 626 and the drain electrode 628 are provided at both sides of the gate electrode 624.

In the switching device 600 as the HEMT in FIG. 22, it is possible to form the gate insulation film 622 by the formation of the gate insulation film in any of the first to fifth embodiments. By forming the gate insulation film 622 as described above, it is possible to suppress the formation of the gallium oxide layer at the interface 630 between the gate insulation film 622 and the carrier supply layer 620. In the switching device 600 according to the second modification, the gallium oxide layer does not exist at the interface 630 or the thickness of the gallium oxide layer at the interface 630 being equal to or smaller than 1 nm. Therefore, the interface state density at the interface 630 is lower. The interface state density at the interface 630 has a large influence on the behavior of the two-dimensional electron gas right below it. It is possible to enhance the property of the switching device 600 by reducing the interface state density at the interface 630.

The ozone is used as the oxidizing gas in the formation of the gate insulation film described in each of the first to fifth embodiments. As the oxidizing gas, another gas capable of oxidizing silicon such as oxygen or water vapor may be used. Since ozone has higher oxidation level than oxygen and water vapor, it is possible to form the gate insulation film even though the heating temperature for the gallium nitride semiconductor substrate in the formation of the gate insulation film is relatively low. By setting relatively low temperature for the heating temperature for such gallium nitride semiconductor substrate, it is possible to suppress the diffusion of gallium from the gallium nitride semiconductor substrate during the formation of the gate insulation film. Thus, it is possible to prevent deterioration of the property of the switching device.

Although the embodiments have been described in detail above, these are merely examples and do not limit the scope of present disclosure. The techniques described in the claims include various modifications and modifications of the specific examples illustrated above. The technical elements described in the present specification or the drawings exhibit technical usefulness alone or in various combinations, and are not limited to the combinations described in the present disclosure at the time of filing. In addition, the techniques illustrated in the present specification or drawings achieve a plurality of objectives at the same time, and achieving one of the objectives itself has technical usefulness.

What is claimed is:

1. A switching device comprising:
   a gallium nitride semiconductor layer; and
   a gate insulation film made of silicon oxide and disposed above the gallium nitride semiconductor layer,
   wherein an interface between the gallium nitride semiconductor layer and the gate insulation film is either free of a gallium oxide layer or provided with the gallium oxide layer with a thickness of 1 nanometer or smaller, and a dipole is not formed across the interface between the gallium nitride semiconductor layer and the gate insulation film.

2. A switching device comprising:
a gallium nitride semiconductor layer; and
a gate insulation film made of silicon oxide and disposed above the gallium nitride semiconductor layer,
wherein an interface between the gallium nitride semiconductor layer and the gate insulation film is free of a gallium oxide layer.

3. The switching device according to claim 2,
wherein the gate insulation film is free of an amorphous layer.

4. The switching device according to claim 3, further comprising:
an electrode being in direct contact with the gate insulation film.

5. A switching device comprising:
a gallium nitride semiconductor layer;
a silicon oxide gate insulation film disposed above the gallium nitride semiconductor layer; and
a dipole-free interface between the gallium nitride semiconductor layer and the silicon oxide gate insulation film that is either free of a gallium oxide layer or that includes the gallium oxide layer with a thickness of 1 nm or less.

* * * * *